United States Patent
Lin et al.

(10) Patent No.: US 8,163,625 B2
(45) Date of Patent: Apr. 24, 2012

(54) METHOD FOR FABRICATING AN ISOLATION STRUCTURE

(75) Inventors: Yih-Ann Lin, Jhudong Township (TW); Hao-Ming Lien, Hsinchu (TW); Ryan Chia-Jen Chen, Chiayi (TW); Jr Jung Lin, Wurih Township (TW); Yu Chao Lin, Rende Township (TW); Chih-Han Lin, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/753,972

(22) Filed: Apr. 5, 2010

(65) Prior Publication Data

US 2010/0255654 A1   Oct. 7, 2010

Related U.S. Application Data

(60) Provisional application No. 61/167,323, filed on Apr. 7, 2009.

(51) Int. Cl.
 *H01L 21/76* (2006.01)
(52) U.S. Cl. ................. 438/424; 257/E21.546
(58) Field of Classification Search .................. 438/424; 257/E21.546
 See application file for complete search history.

(56) References Cited

U.S. PATENT DOCUMENTS

| | | | |
|---|---|---|---|
| 6,100,160 A * | 8/2000 | Hames | 438/424 |
| 6,964,893 B2 * | 11/2005 | Matsuo | 438/199 |
| 7,361,571 B2 * | 4/2008 | Nam | 438/424 |
| 7,491,563 B2 * | 2/2009 | Buehrer et al. | 438/42 |
| 7,786,016 B2 * | 8/2010 | Sinha et al. | 438/705 |
| 2008/0171438 A1 * | 7/2008 | Sinha et al. | 438/689 |
| 2009/0275205 A1 * | 11/2009 | Kiehlbauch et al. | 438/712 |
| 2010/0295148 A1 * | 11/2010 | Sinha et al. | 257/510 |

* cited by examiner

*Primary Examiner* — Alexander Ghyka
*Assistant Examiner* — Stanetta Isaac
(74) *Attorney, Agent, or Firm* — Lowe Hauptman Ham & Berner, LLP

(57) ABSTRACT

The disclosure relates to integrated circuit fabrication, and more particularly to an electronic device with an isolation structure having almost no divot. An exemplary method for fabricating an isolation structure, comprising: forming a pad oxide layer over a top surface of a substrate; forming an opening in the pad oxide layer, exposing a portion of the substrate; etching the exposed portion of the substrate, forming a trench in the substrate; filling the trench with an insulator; exposing a surface of the pad oxide layer and a surface of the insulator to a vapor mixture including at least an NH3 and a fluorine-containing compound; and heating the substrate at a temperature between 100° C. to 200° C.

21 Claims, 8 Drawing Sheets

METHOD FOR FABRICATING AN ISOLATION STRUCTURE

CROSS-REFERENCE TO RELATED APPLICATIONS

The present application claims priority of U.S. Provisional Patent Application Ser. No. 61/167,323, filed on Apr. 7, 2009, which is incorporated herein by reference in its entirety.

TECHNOLOGY FIELD

The disclosure relates to integrated circuit fabrication, and more particularly to an electronic device with an isolation structure.

BACKGROUND

Because miniaturization of elements in integrated circuit electronic devices drives the industry, the width and the pitch of active regions are becoming smaller. Thus, the use of traditional local oxidation of silicon (LOCOS) isolation techniques is gradually replaced by shallow trench isolation (STI). Because it creates relatively little of the bird's beak characteristic, STI is considered to be a more viable isolation technique than LOCOS.

A conventional STI fabrication technique typically comprises: forming a pad oxide on an upper surface of a semiconductor substrate; forming a hardmask layer comprising nitride, such as silicon nitride, having a thickness generally greater than 600 Å, on the semiconductor substrate; forming an opening in the hardmask layer; performing anisotropic etching to form a trench in the semiconductor substrate; forming a thermal oxide liner in the trench and then filling the trench with silicon oxide as an insulating material; and forming an overburden on the hardmask layer. Planarization, such as chemical mechanical polishing (CMP), is then performed. During subsequent processing, the hardmask layer is removed along with the pad oxide, which typically involves cleaning steps. During such cleaning steps, the top corners of the silicon oxide are isotropically removed leaving a void or "divot" in the silicon oxide filled area. This is due to the use of hydrofluoric (HF) acid in the cleaning steps, which partially etches the silicon oxide.

FIG. 1 illustrates an STI structure 12 having divots 16. A dielectric layer 14 is over the substrate 10 and a portion thereof is embedded in the substrate 10. The divots 16 are problematic in various respects. For example, the divots 16 are formed at the trench edges (corners) where high electrical fields are present during device operation and thus cause device degradation including junction leakage and reverse short channel effects. Another drawback in the formation of divots at the STI trench edges is that a divot will trap residual polysilicon and/or metals 18 in subsequent processes, thereby increasing the likelihood of electrical shorting.

Accordingly, what is needed is a method for fabricating an isolation structure being etched by dry chemical having almost no divot.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
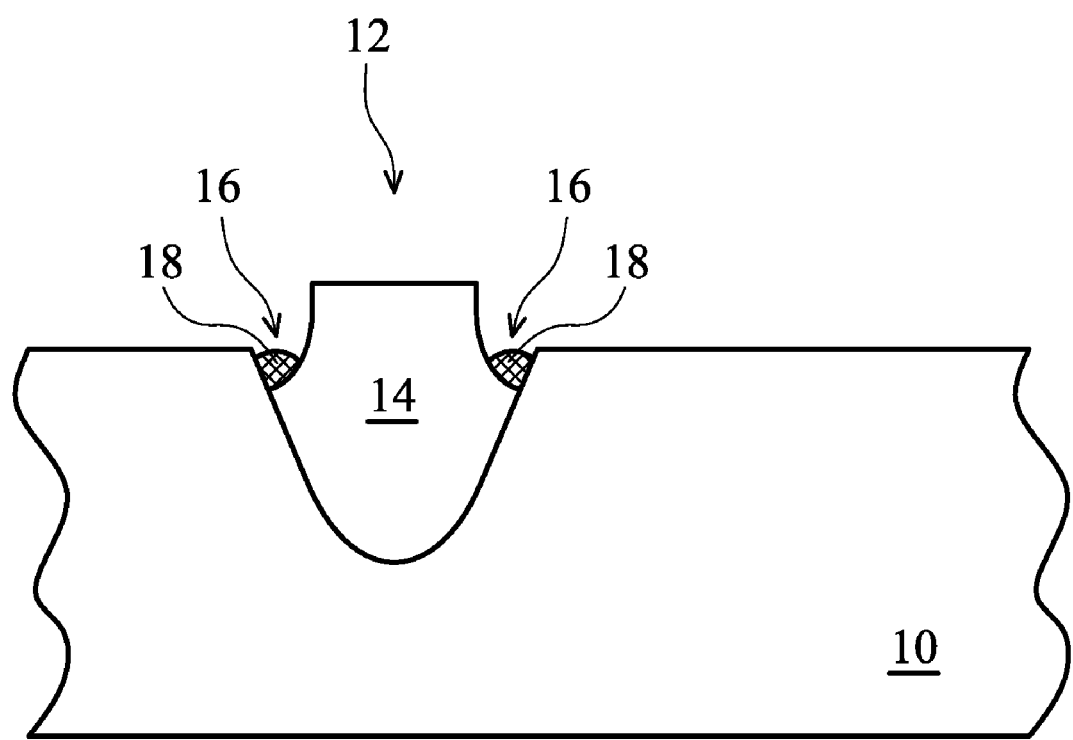
FIG. 1 shows a cross section of a conventional STI structure having divots.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
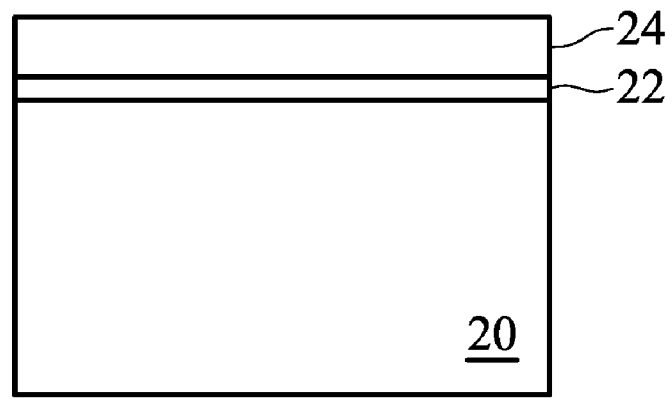
FIGS. 2a-2h show schematic cross sections of an embodiment of a method for fabricating an isolation structure of the invention, showing various stages of fabrication.

FIGS. 2a-h show schematic cross sections representing an isolation structure at various stages of feature formation in an embodiment of an electronic device manufacturing process of the invention. Referring to FIG. 2a, a substrate 20 is provided. In one embodiment, the substrate 20 includes a silicon substrate (e.g., wafer) in crystalline structure. Other examples of the substrate 20 may include other elementary semiconductors such as germanium and diamond. Alternatively, the substrate 20 may include a compound semiconductor such as, silicon carbide, gallium arsenide, indium arsenide, or indium phosphide. The substrate 20 may include various doping configurations depending on design requirements (e.g., p-type substrate or n-type substrate). Further, in some embodiments, the substrate 20 may include an epitaxial layer (epi layer), may be strained for performance enhancement, and/or may include a silicon-on-insulator (SOI) structure.

Still referring to FIG. 2a, a pad oxide layer 22 is formed over the top surface of the substrate 20. In some embodiments, The pad oxide layer 22 is preferably formed of silicon oxide grown by a thermal oxidation process, having a thickness of about 80 to 150 Å. For example, the pad oxide layer 22 can be grown by the rapid thermal oxidation (RTO) process or in a conventional annealing process which includes oxygen. A hardmask layer 24, for example a silicon nitride or silicon oxynitride layer, is formed over the pad oxide layer 22. The hardmask layer 24 can be deposited by, for example, a CVD process, or a low pressure CVD (LPCVD) process. In some embodiments, the formed hardmask layer 24 preferably has a thickness of about 600 to 1500 Å.

Figure 2B:
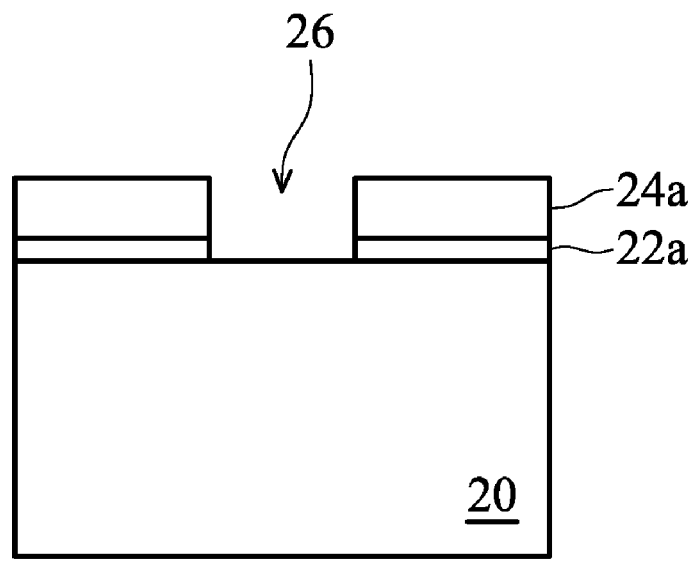

Referring to FIG. 2b, following formation of the hardmask layer 24, a patterned photo-sensitive layer (not shown) is formed on the hardmask layer 24. A reactive ion etching (RIE) or a high density plasma (HDP) process may, for example, be used to anisotropically etch through the hardmask layer 24 and the pad oxide layer 22 to form an opening 26 in the hardmask layer 24a and the pad oxide layer 22a, exposing a portion of the substrate 20.

Figure 2C:
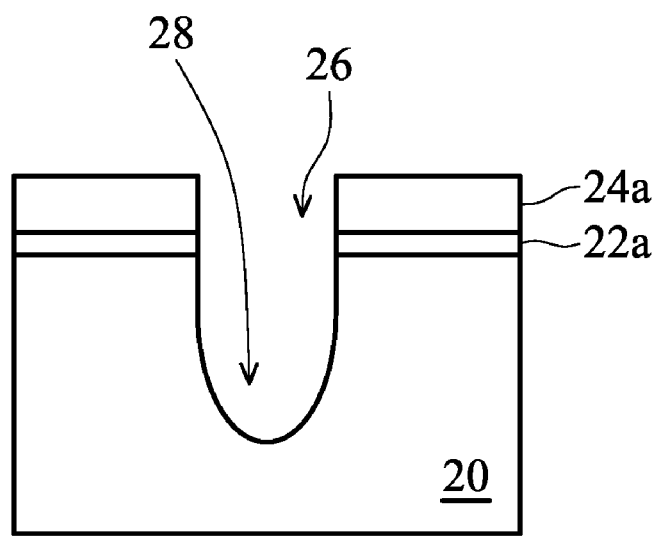

Referring to FIG. 2c, following formation of the opening 26 in the hardmask layer 24a and the pad oxide layer 22a, the exposed portion of the substrate 20 is etched to form a trench 28 having a predetermined depth of between about 300 to 3000 Å in the substrate 20. In some embodiments, the trench 28 is etched to have sloped trench sidewalls and preferably having an angle between about 80°~90° with rounded top and bottom rounded corners to minimize stress. Subsequently, the patterned photo-sensitive layer is stripped after the trench 28 formation.

Figure 2D:
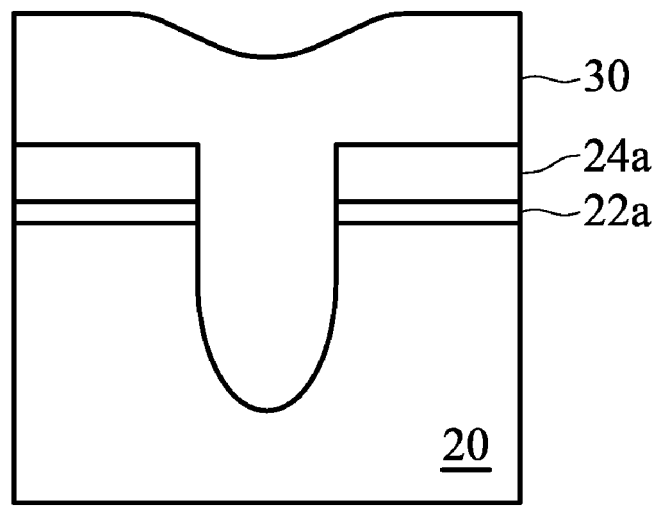

Referring to FIG. 2d, following formation of the trench 28, a liner layer (not shown) is formed substantially conformal over the substrate 20, including along the walls of the trench 28. The liner layer is a dielectric layer (e.g., an oxide layer, nitride layer, oxynitride layer or combination thereof) formed by a thermal oxidation process or CVD process. In at least one embodiment, the liner layer may preferably have a thickness of about 30 to 200 Å. In some embodiments, the liner layer is provided for reducing damage on the surface of the trench 28 created by the opening-etch process as set forth above. In some embodiments, the liner layer is not used.

Still referring to FIG. 2d, following formation of the liner layer, an insulator 30 is formed over the liner layer, filling the trench 28 and the opening 26. For example, the insulator 30 is deposited to a thickness of 4000 to 8000 Å. The insulator 30 can be, for example, an oxide layer formed by a CVD process, such as HDP CVD process or sub-atmospheric CVD (SACVD) process. In some embodiments, the insulator 30 comprises a HDP CVD oxide layer. The insulator 30 can be deposited under a pressure less than 10 mTorr and a temperature of about 500 to 1000° C., using silane and oxygen as reacting precursors. In other embodiments, the insulator 30 comprises a sub-atmospheric undoped-silicon glass (SAUSG) layer. The insulator 30 can be deposited under a pressure of about 500 to 700 torr and a temperature of about 500 to 600° C., using tetraethoxysilane (TEOS) and $O_3$ as reacting precursors. In these embodiments using the SAUSG layer, the flow rate ratio of $O_3$ to TEOS is between about 2 to about 20. Preferably, the flow rate ratio of $O_3$ to TEOS is about 5 or more. In some embodiments, lower flow rate ratio of $O_3$ to TEOS (e.g., about 4) may result in a seam formed within the insulator 30. For example, if the top of the trench 28 closes before the trench 28 is completely filled, reactants $O_3$ and TEOS are trapped within the lower region between the insulators 30 formed on both sidewalls of the trench 28. The flow rate ratio of $O_3$ to TEOS which may result in this seam in the insulator 30, however, may depend on the aspect ratio (height/width) and shape of the trench 28. One of ordinary skill in the art, based on the description set forth above, can readily achieve a desired dielectric layer by adjusting the flow rate ratio of $O_3$ to TEOS.

Still referring to FIG. 2d, in some embodiments, following formation of the insulator 30 within the trench 28 and the opening 26, an anneal process is performed to increase the density of the insulator 30. This results in an interface between the liner layer (not shown) and the insulator 30 disappeared after the anneal process. The anneal process can be performed, for example, in a furnace, a rapid thermal process (RTP) system, or other thermal system that is adapted to provide a thermal treatment for the insulator 30 to obtain a desired film quality. In some embodiments, the anneal process may be performed at about 1000° C. for about 20 seconds in a RTP system in an environment containing nitrogen, an inert gas, or other gas that will not substantially react with the insulator 30.

Figure 2E:
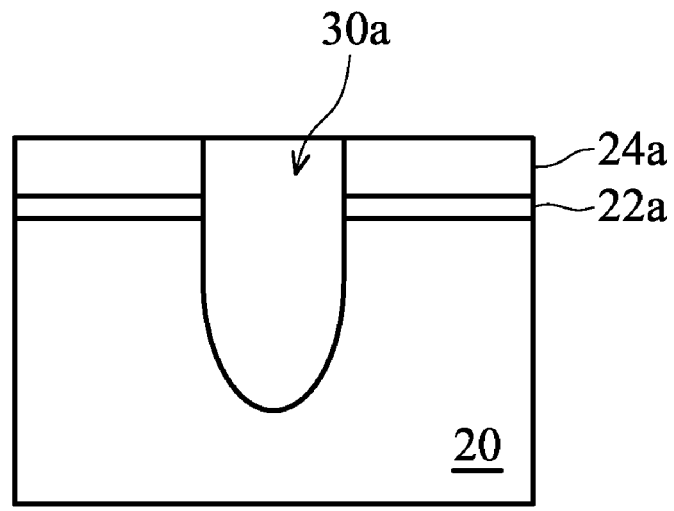

Referring to FIG. 2e, planarization (not shown), such as a chemical mechanical polishing (CMP) process, is performed to remove portions of the insulator 30 above the hardmask layer 24a to expose the hardmask layer 24a, thereby leaving an insulator 30a respectively filling the trench 28 and the openings 26. The hardmask layer 24a also serves as a stop layer for stopping the planarization process on the hardmask layer 24a. In some embodiments, a top surface of the insulator 30a is or substantially coplanar with the hardmask layer 24a.

Figure 2F:
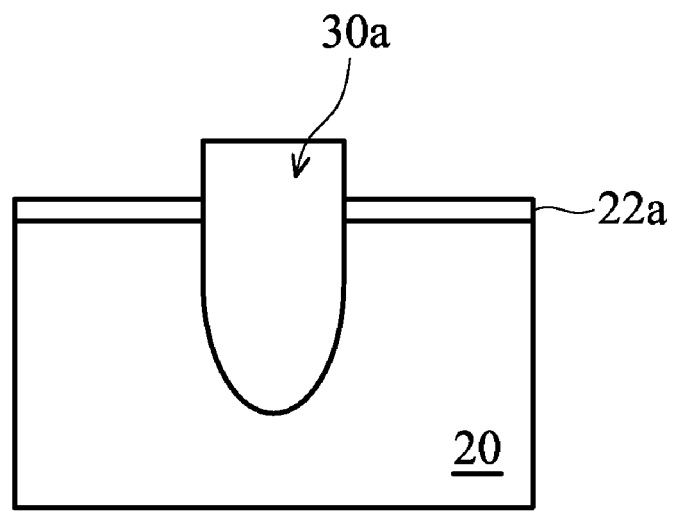

Referring to FIG. 2f, subsequent to the planarization process, the hardmask layer 24a is removed by a wet chemical etching process, for example, by dipping the substrate 20 in hot phosphoric acid ($H_3PO_4$), exposing a top surface of the pad oxide layer 22a. Because the wet chemical etching process has higher etch selectivity for nitride than to oxide, the etch process removes the hardmask layer 24a faster than the insulator 30a. Accordingly, the remaining insulator 30a extends over a top surface of the pad oxide layer 22a.

Figure 2G:
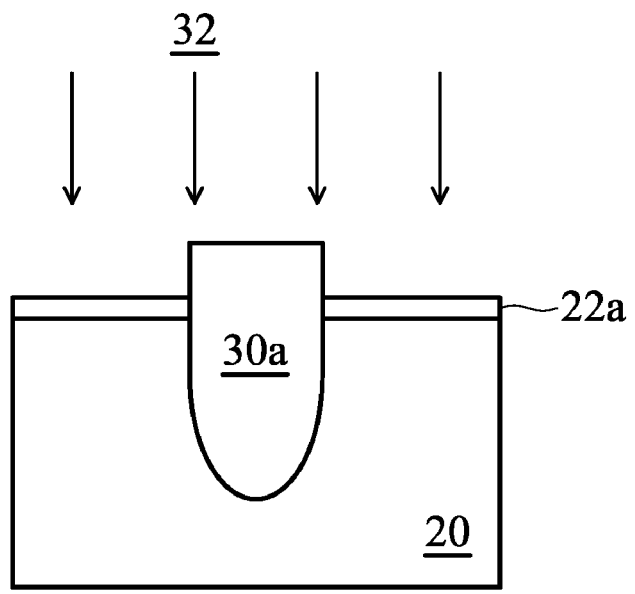

Referring to FIG. 2g, subsequent to the hardmask layer removal process, the pad oxide layer 22a is removed by a vapor phase etching process 32, which is a dry etching process. The vapor phase etching process 32 starts with introducing the structure of FIG. 2g into a sealed reaction chamber in which the vapor phase etching process 32 uses gas phase reactants to perform a self-limiting etch that is adjustable by controlling the parameters in the reaction chamber. In some embodiments, the vapor phase etching process 32 comprise a vapor mixture including at least an NH3 and a fluorine-containing compound employed as a catalyst and an etchant, respectively. In some embodiments, the fluorine-containing compound may be a compound selected from the group of HF or NF3.

The vapor phase etching process 32 is a multiple step process. First, a blanket adsorbed reactant film of the vapor mixture of fluorine-containing compound and NH3 vapor may be formed over the top surface of the pad oxide layer 22a and the top surface of the insulator 30a in the reaction chamber, which is performed at a pressure between 0.1 mTorr and 10 mTorr and at a temperature between 20° C. and 40° C. The adsorbed reactant film may react with the top surface of the pad oxide layer 22a in contact therewith to form a first condensed and solid reaction product beneath the adsorbed reactant film. The adsorbed reactant film may also react with the top surface of the insulator 30a in contact therewith to form a second condensed and solid reaction product beneath the adsorbed reactant film. In some embodiments, reaction radicals may be generated in a plasma from fluorine-containing compound and NH3 precursor gases in the reaction chamber. The reaction radicals may react with the top surface of the pad oxide layer 22a in contact therewith to form a first condensed and solid reaction product. The reaction radicals may also react with the top surface of the insulator 30a in contact therewith to form a second condensed and solid reaction product.

Next, the reaction chamber may be heated to a temperature between 100° C. to 200° C. while sublimation products of the first solid reaction product and the second solid reaction product may be pumped out from the reaction chamber. In some alternative embodiments, the reaction chamber may be heated to a temperature between 100° C. to 200° C. while flowing a carrier gas over the substrate 20 to remove the first solid reaction product and the second solid reaction product from the reaction chamber. The carrier gas can be any inert gas. In some embodiments, the carrier gas preferably comprises N2, He, or Ar. In some embodiments, the substrate 20 is transferred into a heated chamber that is heated to a temperature between 100° C. to 200° C. while sublimation products of the first solid reaction product and the second solid reaction product may be pumped out from the reaction chamber. In some alternative embodiments, the substrate 20 is transferred into a heated chamber that is heated to a temperature between 100° C. to 200° C. while flowing a carrier gas over the substrate 20 to remove the first solid reaction product and the second solid reaction product from the heated chamber. The carrier gas can be any inert gas. Preferably, the inert gas includes N2, He, or Ar. Ratio of removal rates of the insulator 30a and the pad oxide layer 22a in the step of exposing the surface of the pad oxide layer 22a and the surface of the insulator 30a to the vapor mixture is less than 0.9. In other words, the insulator 30a removal rate is less than 90% of the removal rate of the pad oxide 22a. This reaction proceeds until after all of the pad oxide layer 22a is removed, but only a portion of the insulator 30a above the substrate 20 is removed.

Figure 2H:
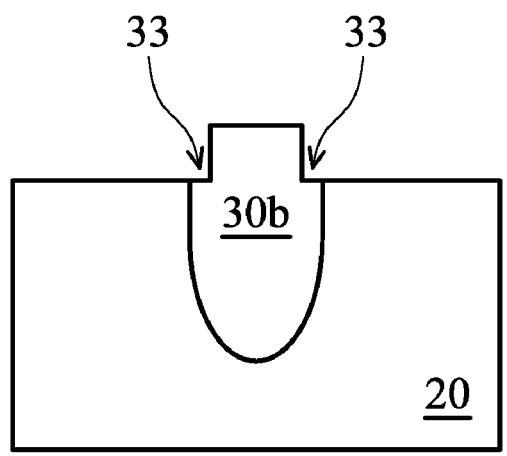

Accordingly, at the end of the vapor phase etching process 32 shown in FIG. 2h, an insulator 30b having almost no divot remains to serve as an first isolation structure 33 between electronic devices. The first isolation structure 33 partially protrudes over a top surface of the substrate 20, showing almost no divot.

In some embodiments, the vapor mixture comprising HF and NH3. The vapor mixture of HF and NH3 has a ratio of HF to NH3, which is between about 0.1 to 10, and preferably a ratio of 3 units of HF to 1 unit of NH3. In other embodiments, the vapor mixture comprising NF3 and NH3. The vapor mixture of NF3 and NH3 comprises a ratio of NF3 to NH3, which is between about 0.1 to 10, preferably a ratio of 1 unit of NF3 to 1 unit of NH3.

Figure 3:
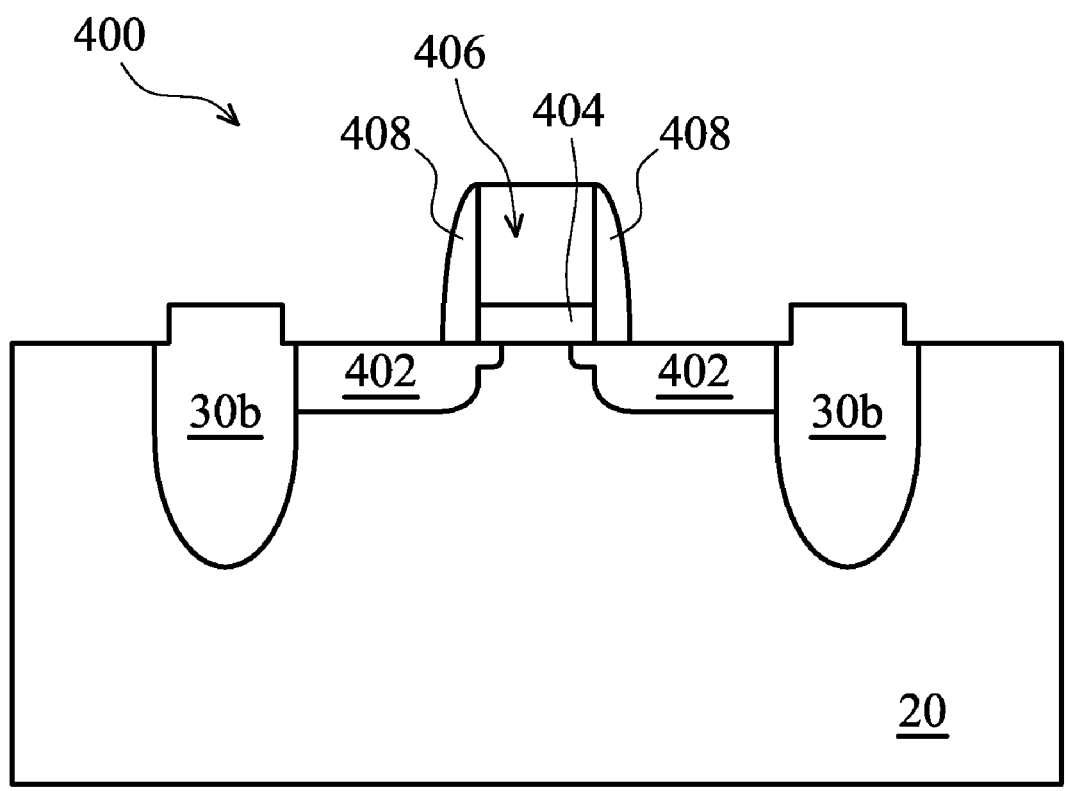
FIG. 3 is a cross-sectional view of an electronic device having an isolation structure of the embodiment depicted by FIGS. 2a-ah.

Referring to FIG. 3, an electronic device such as a metal-oxide-semiconductor (MOS) transistor 400 can be formed over a portion of the substrate 20 adjacent to the first isolation structure 33. Fabrication of the MOS transistor 400 is well known to those skilled in the art and is thus not described here, for brevity. The MOS transistor 400 now includes source/drain regions 402 formed in a portion of the substrate 20, a gate stack having a gate dielectric layer 404 and a gate electrode 406 sequentially formed over the substrate 20, and spacers 408 respectively formed on both sidewalls of the gate stack. In some embodiment, the electronic device comprises a gate with a gate length less than 32 nm.

In some embodiment, the gate dielectric layer 404 may comprise silicon oxide, silicon oxynitride, high dielectric constant (high-k) dielectric layer, or combination thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The gate dielectric layer 404 may further comprise an interfacial layer to reduce damages between the gate dielectric layer 404 and the substrate 20. The interfacial layer may comprise silicon oxide.

In some embodiments, the gate electrode 406 may comprise a polysilicon gate or a metal gate. The metal gate may comprise one or more layers including Ti, TiN, TaN, Ta, TaC, TaSiN, W, WN, MoN, MoON, $RuO_2$, and/or other suitable materials. The metal gate may comprise one or more layers formed by PVD, CVD, ALD, plating, and/or other suitable processes. The metal gate may be formed by a gate-first or a gate-last metal gate fabrication processes.

Figure 4A:
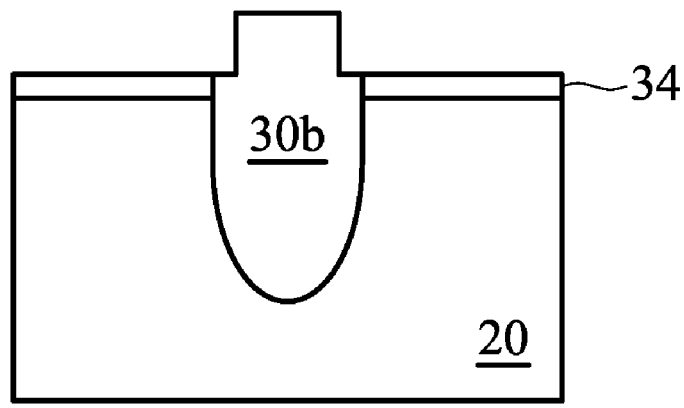
FIGS. 4a-4c show schematic cross sections of another embodiment of a method for fabricating an isolation structure of the invention, showing various stages of fabrication.

FIGS. 4 shows schematic cross sections of another embodiment of a method for fabricating an isolation structure of the invention, showing various stages of fabrication. In an embodiment depicted in FIG. 2h, the pad oxide layer 22a of FIG. 2g has been removed before the vapor phase etching process 32 is terminated. Referring to FIG. 4a, in order to reduce damage on the portion of the substrate 20 adjacent to the first isolation structure 33 created by the etch process of the pad oxide layer 22a, a sacrificial oxide layer 34 is further formed over the portion of the substrate 20 adjacent to the first isolation structure 33 and is not formed over the first isolation structure 33 after the heating step. The sacrificial oxide layer 34 may be substantially similar to the pad oxide layer 22 with reference to FIG. 2a. The sacrificial oxide layer 34 is preferably formed of silicon oxide grown by a thermal oxidation process, having a thickness of about 80 to 150 Å. For example, the sacrificial oxide layer 34 can be grown by the rapid thermal oxidation (RTO) process or in a conventional annealing process comprising oxygen.

Figure 4B:
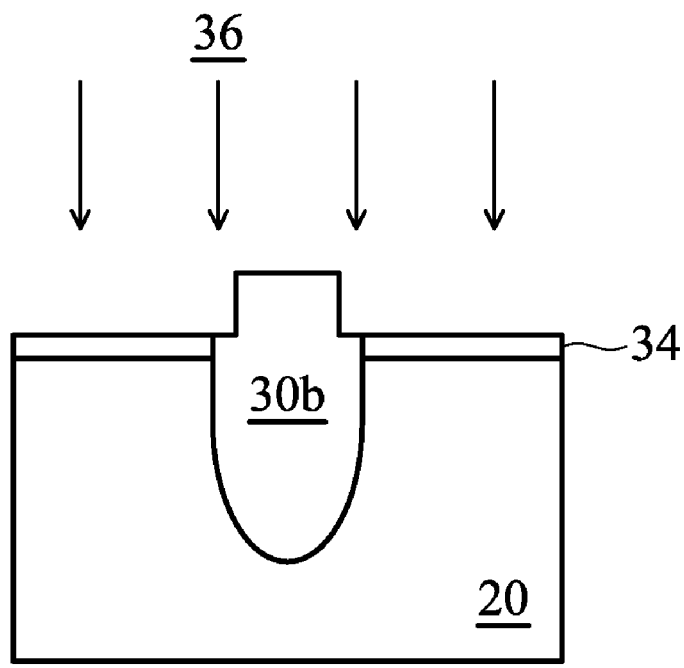
Figure 4C:
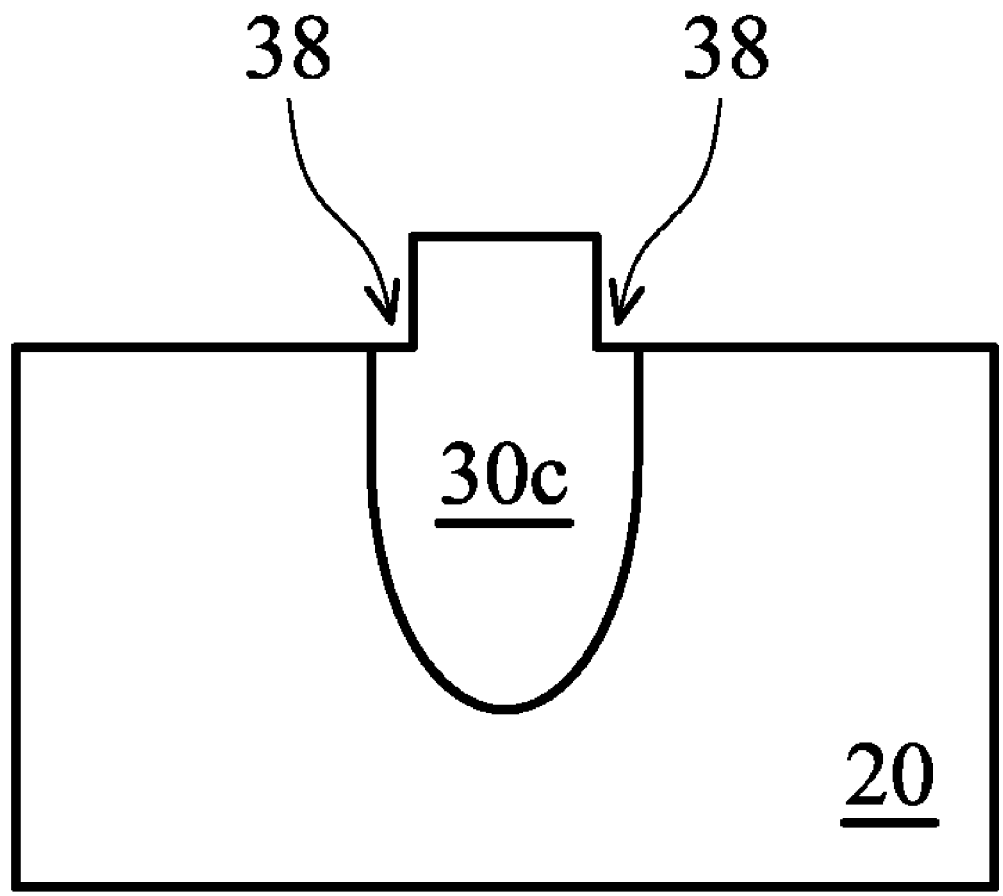

Referring to FIG. 4b, following formation of the sacrificial oxide layer 34. The sacrificial oxide layer 34 is removed by a vapor phase etching process 36, which is a dry etching process and is substantially similar to the vapor phase etching process 32 with reference to FIG. 2g. The vapor phase etching process 36 starts with introducing the substrate 20 into the sealed reaction chamber in which the vapor phase etching process 36 uses gas phase reactants to perform a self-limiting etch that is adjustable by controlling the parameters in the reaction chamber. In some embodiments, the vapor phase etching process 36 employed in the present invention comprise a vapor mixture including at least an NH3 and a fluorine-containing compound employed respectively as a catalyst and an etchant. The fluorine-containing compound may be a compound selected from the group of HF or NF3.

The vapor phase etching process 36 is a multiple step process. First, a blanket adsorbed reactant film of the vapor mixture of fluorine-containing compound and NH3 vapor may be formed over a top surface of the sacrificial oxide layer 34 and a top surface of the insulator 30b in the reaction chamber, which is performed at a pressure between 0.1 mTorr and 10 mTorr and at a temperature between 20° C. and 40° C. The adsorbed reactant film may react with the top surface of the sacrificial oxide layer 34 in contact therewith to form a first condensed and solid reaction product beneath the adsorbed reactant film. The adsorbed reactant film may react with the top surface of the insulator 30b in contact therewith to form a second condensed and solid reaction product beneath the adsorbed reactant film. In some embodiments, reaction radicals may be generated in a plasma from fluorine-containing compound and NH3 precursor gases in the reaction chamber. The reaction radicals may react with the top surface of the sacrificial oxide layer 34 in contact therewith to form a first condensed and solid reaction product. The reaction radicals may react with the top surface of the insulator 30b in contact therewith to form a second condensed and solid reaction product.

Next, the reaction chamber may be heated to a temperature between 100° C. to 200° C. while the sublimation products of the first solid reaction product and the second solid reaction product may be pumped out from the reaction chamber. In some alternative embodiments, the reaction chamber may be heated to a temperature between 100° C. to 200° C. while flowing a carrier gas over the substrate 20 to remove the first solid reaction product and the second solid reaction product from the reaction chamber. The carrier gas can be any inert gas. In some embodiments, the carrier gas preferably comprises N2, He, or Ar. In some embodiments, the substrate 20 is transferred into a heated chamber that is heated to a temperature between 100° C. to 200° C. while the sublimation products of the first solid reaction product and the second solid reaction product may be pumped out from the reaction chamber. In some alternative embodiments, the substrate 20 is transferred into a heated chamber that is heated to a temperature between 100° C. to 200° C. while flowing a carrier gas over the substrate 20 to remove the first solid reaction product and the second solid reaction product from the heated chamber. The carrier gas can be any inert gas. Preferably, the carrier gas comprises N2, He, or Ar. Ratio of removal rates of the insulator 30b and the sacrificial oxide layer 34 in the step of exposing the top surface of the sacrificial oxide layer 34 and the top surface of the insulator 30b to the vapor mixture is less than 0.9. In other words, the insulator 30b removal rate is less than 90% of the removal rate of the sacrificial oxide layer 34. This reaction proceeds until after all of the sacrificial oxide layer 34 is removed, but only a portion of the insulator 30b above the substrate 20 is removed. Accordingly, at the end of the vapor phase etching process 36 shown in FIG. 4c, an insulator 30c having almost no divot remains to serve as an second isolation structure 38 between electrical devices. The second isolation structure 38 partially protrudes over the top surface of the substrate 20. Then referring to FIG. 3, an electronic device such as a metal-oxide-semiconductor (MOS) transistor 400 can be formed over a portion of the substrate 20 adjacent to the second isolation structure 38 having almost no divot.

In some embodiments, the vapor mixture comprising HF and NH3. The vapor mixture of HF and NH3 has a ratio of HF to NH3, which is between about 0.1 to 10, and preferably a ratio of 3 units of HF to 1 unit of NH3. In other embodiments, the vapor mixture comprising NF3 and NH3. The vapor mixture of NF3 and NH3 comprises a ratio of NF3 to NH3, which is between about 0.1 to 10, preferably a ratio of 1 unit of NF3 to 1 unit of NH3. Accordingly, applicant's method allows fabricating an isolation structure with almost no divot.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate an isolation structure with almost no divot. In this way, an isolation structure or region is formed with almost no divot.

What is claimed is:

1. A method of fabricating an isolation structure, comprising:
    forming a pad oxide layer over a top surface of a substrate;
    forming an opening in the pad oxide layer, exposing a portion of the substrate;
    etching the exposed portion of the substrate, forming a trench in the substrate;
    filling the trench with an insulator;
    exposing a surface of the pad oxide layer and a surface of the insulator to a vapor mixture including at least an NH3 and a fluorine-containing compound; and
    heating the substrate at a temperature between 100° C. and 200° C.,
    wherein a ratio of removal rates of the insulator and the pad oxide layer during the exposure of the surface of the pad oxide layer and the surface of the insulator to the vapor mixture is less than 0.9.

2. The method of claim 1 further comprising
    forming a hardmask layer over the pad oxide;
    patterning the hardmask layer;
    planarizing the insulator, exposing the hardmask layer; and
    removing the hardmask layer, exposing the surface of the pad oxide layer.

3. The method of claim 1 further comprising forming an electronic device formed over a portion of the substrate adjacent to the isolation structure.

4. The method of claim 3, wherein the electronic device comprises a gate with a gate length less than 32 nm.

5. The method of claim 1, wherein the trench is filled with the insulator by high density plasma chemical vapor deposition (HDPCVD) or sub-atmospheric chemical vapor deposition (SACVD).

6. The method of claim 1, wherein the isolation structure partially protrudes over the top surface of the substrate.

7. The method of claim 1, wherein the fluorine-containing compound is a compound selected from the group of HF or NF3.

8. The method of claim 1, wherein the vapor mixture comprises HF and NH3.

9. The method of claim 8, wherein the vapor mixture of HF and NH3 comprises a ratio of 3 units of HF to 1 units of NH3.

10. The method of claim 1, wherein the vapor mixture comprises NF3 and NH3.

11. The method of claim 10, wherein the vapor mixture of NF3 and NH3 comprises a ratio of 1 unit of HF to 1 unit of NH3.

12. The method of claim 1, wherein the exposure of the surface of the pad oxide layer and the surface of the insulator to the vapor mixture is performed at a pressure between 0.1 mTorr and 10 mTorr and at a temperature between 20° C. and 40° C.

13. The method of claim 1, wherein the step of heating the substrate comprises while flowing a carrier gas over the substrate.

14. The method of claim 13, wherein the carrier gas comprises a material selected from the group consisting of N2, He, Ar, or combinations thereof.

15. A method of fabricating an isolation structure, comprising:
    forming a pad oxide layer over a top surface of a substrate;
    forming an opening in the pad oxide layer, exposing a portion of the substrate;
    etching the exposed portion of the substrate, forming a trench in the substrate;
    filling the trench with an insulator;
    exposing a surface of the pad oxide layer and a surface of the insulator to a vapor mixture including at least an NH3 and a fluorine-containing compound;
    performing a first heating to heat the substrate at a temperature between 100° C. and 200° C.;
    forming a sacrificial oxide layer over a portion of the substrate after the performance of the first heating;
    exposing a surface of the sacrificial oxide layer and a surface of the insulator after the performance of the first heating to another vapor mixture including at least an NH3 and a fluorine-containing compound; and
    performing a second heating to heat the substrate at a temperature between 100° C. and 200° C. after the exposure to the another vapor mixture.

16. The method of claim 15, wherein the fluorine-containing compound is a compound selected from the group of HF or NF3.

17. The method of claim 15, wherein the vapor mixture comprises HF and NH3.

18. The method of claim 15, wherein the vapor mixture comprises NF3 and NH3.

19. The method of claim 15, wherein the step of heating the substrate comprises while flowing a carrier gas over the substrate.

20. The method of claim 15, wherein a ratio of removal rates of the insulator and the pad oxide layer during the exposure of the surface of the pad oxide layer and the surface of the insulator to the vapor mixture is less than 0.9.

21. A method of fabricating an isolation structure, comprising:

forming a pad oxide layer over a top surface of a substrate;

forming an opening in the pad oxide layer, exposing a portion of the substrate;

etching the exposed portion of the substrate, forming a trench in the substrate;

filling the trench with an insulator;

exposing a surface of the pad oxide layer and a surface of the insulator to a vapor mixture including at least an NH3 and a fluorine-containing compound; and heating the substrate at a temperature between 100° C. and 200° C., wherein the trench is filled with the insulator by high density plasma chemical vapor deposition (HDPCVD) or sub-atmospheric chemical vapor deposition (SACVD).

* * * * *